(12) United States Patent
Liao et al.

(10) Patent No.: US 12,190,980 B2
(45) Date of Patent: Jan. 7, 2025

(54) SEMICONDUCTOR MEMORY APPARATUS AND TESTING METHOD THEREOF

(71) Applicant: Winbond Electronics Corp., Taichung (TW)

(72) Inventors: Shao-Ching Liao, Taichung (TW); Chien-Min Wu, Taichung (TW); Kuang-Chih Hsieh, Taichung (TW)

(73) Assignee: Winbond Electronics Corp., Taichung (TW)

(*) Notice: Subject to any disclaimer, the term of this patent is extended or adjusted under 35 U.S.C. 154(b) by 64 days.

(21) Appl. No.: 18/171,666

(22) Filed: Feb. 21, 2023

(65) Prior Publication Data

US 2024/0282397 A1   Aug. 22, 2024

(51) Int. Cl.
*G11C 29/50* (2006.01)

(52) U.S. Cl.
CPC ...... *G11C 29/50* (2013.01); *G11C 2029/5004* (2013.01)

(58) Field of Classification Search
CPC ................. G11C 29/50; G11C 2029/5004
See application file for complete search history.

(56) References Cited

U.S. PATENT DOCUMENTS

| | | | |
|---|---|---|---|
| 10,388,368 B2 | 8/2019 | Danjean et al. | |
| 10,795,765 B2 | 10/2020 | Lu | |
| 10,942,655 B2 | 3/2021 | Danjean et al. | |
| 2008/0195903 A1* | 8/2008 | Zipprich-Rasch | G11C 29/50 714/721 |
| 2009/0167094 A1* | 7/2009 | Tseng | G01R 31/31721 307/80 |
| 2012/0274348 A1* | 11/2012 | Shin | G01R 31/3008 324/762.01 |
| 2013/0218507 A1* | 8/2013 | Waayers | G01R 31/318572 702/120 |

* cited by examiner

*Primary Examiner* — April Y Blair
*Assistant Examiner* — Jeffrey Andrew Yang
(74) *Attorney, Agent, or Firm* — JCIPRNET

(57) ABSTRACT

A semiconductor memory apparatus and a testing method thereof are provided. The semiconductor memory apparatus includes a memory chip and a memory controller. The memory controller is configured to detect an initial test voltage of a target memory cell corresponding to a tailing bit in a main array of the memory chip. After the memory chip is idle for a first time, the memory controller detects a first test voltage of the target memory cell and compares it with a current comparison voltage to determine whether a first stage test is passed. In a case of passing the first stage test, after the memory chip is idle for a second time, the memory controller detects a second test voltage of the target memory cell and compares it with the current comparison voltage to determine whether a second stage test is passed. The comparison voltage is dynamically updated in response to the time the memory chip is idle.

14 Claims, 8 Drawing Sheets

SEMICONDUCTOR MEMORY APPARATUS AND TESTING METHOD THEREOF

BACKGROUND

Technical Field

The disclosure relates to a memory apparatus, and more particularly, to a semiconductor memory apparatus for testing low temperature data retention (LTDR) and a testing method thereof.

Description of Related Art

The LTDR performance is an important reliability item when the chip testing is performed on a NOR flash memory. However, LTDR has strong dependence on time. At present, in practice, a memory chip is required to be left idle for a long waiting time (for example, more than 300 hours) according to specification requirements for observation to test whether the specification requirements are passed. Due to retardation and delay of the time for research and development and the product cycle, the cost for research and development is increased.

SUMMARY

The disclosure provides a semiconductor memory apparatus and a testing method thereof, which may quickly test whether a memory chip may pass specification requirements for low temperature data retention in a relatively short period of time.

A semiconductor memory apparatus in the disclosure includes a memory chip and a memory controller. The memory chip includes a main array and a mini array. The memory controller is coupled to the memory chip, and is configured to detect an initial test voltage of a target memory cell corresponding to a tailing bit in the main array. After the memory chip is idle for a first time, the memory controller detects a first test voltage of the target memory cell and compares the first test voltage with a current comparison voltage to determine whether a first stage test is passed. In a case of passing the first stage test, after the memory chip is idle for a second time, the memory controller detects a second test voltage of the target memory cell and compares the second test voltage with the current comparison voltage to determine whether a second stage test is passed. The comparison voltage is dynamically updated in response to a time the memory chip is idle.

A testing method of a semiconductor memory apparatus in the disclosure is applicable to the semiconductor memory apparatus having a memory chip including a main array and a mini array. The method includes the following. An initial test voltage of a target memory cell corresponding to a tailing bit in the main array is detected. After the memory chip is idle for a first time, a first test voltage of the target memory cell is detected, and the first test voltage is compared with a current comparison voltage to determine whether a first stage test is passed. In a case of passing the first stage test, after the memory chip is idle for a second time, a second test voltage of the target memory cell is detected, and the second test voltage is compared with the current comparison voltage to determine whether a second stage test is passed. The comparison voltage is dynamically updated in response to the time the memory chip is idle.

Based on the above, the semiconductor memory apparatus and the testing method thereof in the disclosure may quickly test whether the memory chip may pass the specification requirements for low temperature data retention in the relatively short period of time, shortening the time for research and development and the product cycle, thereby saving the cost for research and development.

In order for the aforementioned features and advantages of the disclosure to be more comprehensible, embodiments accompanied with drawings are described in detail below.

DETAILED DESCRIPTION OF DISCLOSED EMBODIMENTS

Figure 1:
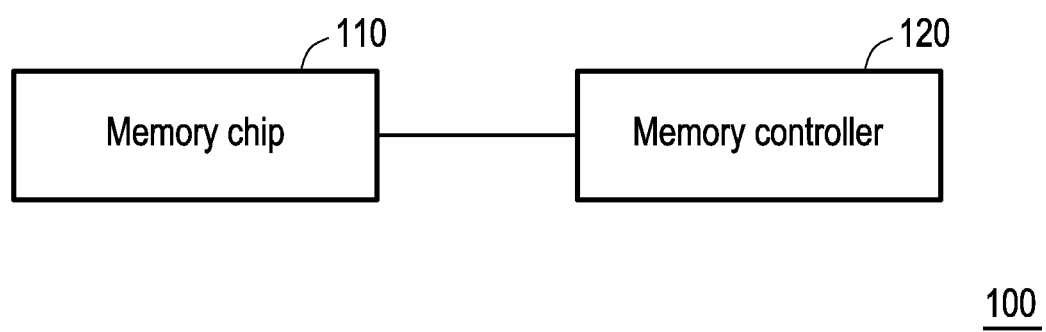
FIG. 1 is a schematic block diagram of a semiconductor memory apparatus according to an embodiment of the disclosure.
Figure 2:
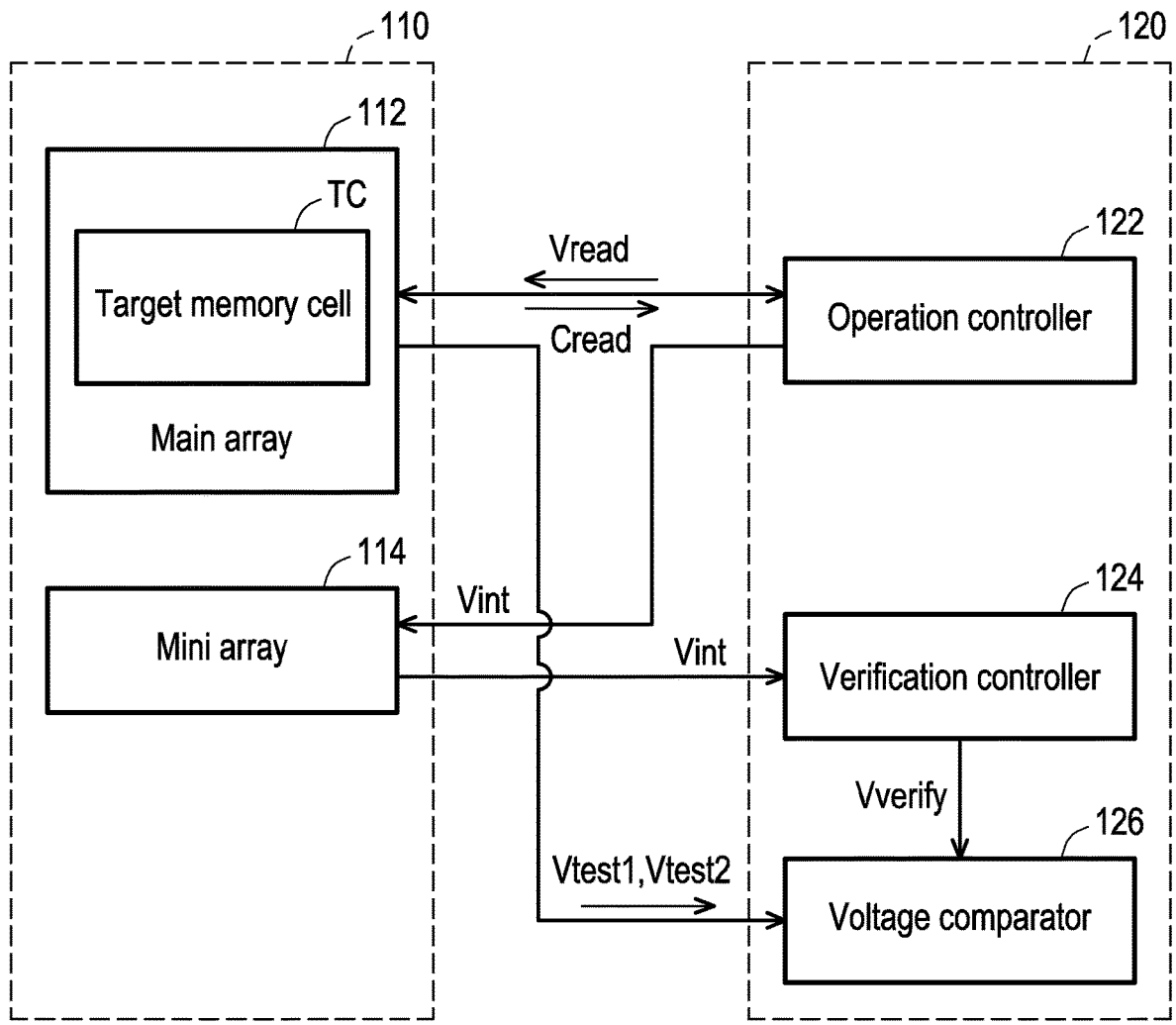
FIG. 2 is a schematic block diagram of a memory chip and a memory controller according to the embodiment in FIG. 1.

Referring to both FIGS. 1 and 2, a semiconductor memory apparatus 100 includes a memory chip 110 and a memory controller 120. The memory chip 110 includes a main array 112 and a mini array 114. The main array 112 and the mini array 114 are formed by, for example, NOR flash memory elements. In this embodiment, the mini array 114 is a memory array independent of the main array 112, and a size thereof is below 1/1000 block. However, the disclosure is not limited thereto.

The memory controller 120 is coupled to the memory chip 110. The memory controller 120 may be a processor, or a hardware circuit designed through a hardware description language (HDL) or any other design methods of a digital circuit known to those skilled in the art, and implemented through a field programmable gate array (FPGA), a complex programmable logic device (CPLD), or an application-specific integrated circuit (ASIC). As shown in FIG. 2, the memory controller 120 includes an operation controller 122, a verification controller 124, and a voltage comparator 126.

Figure 3:
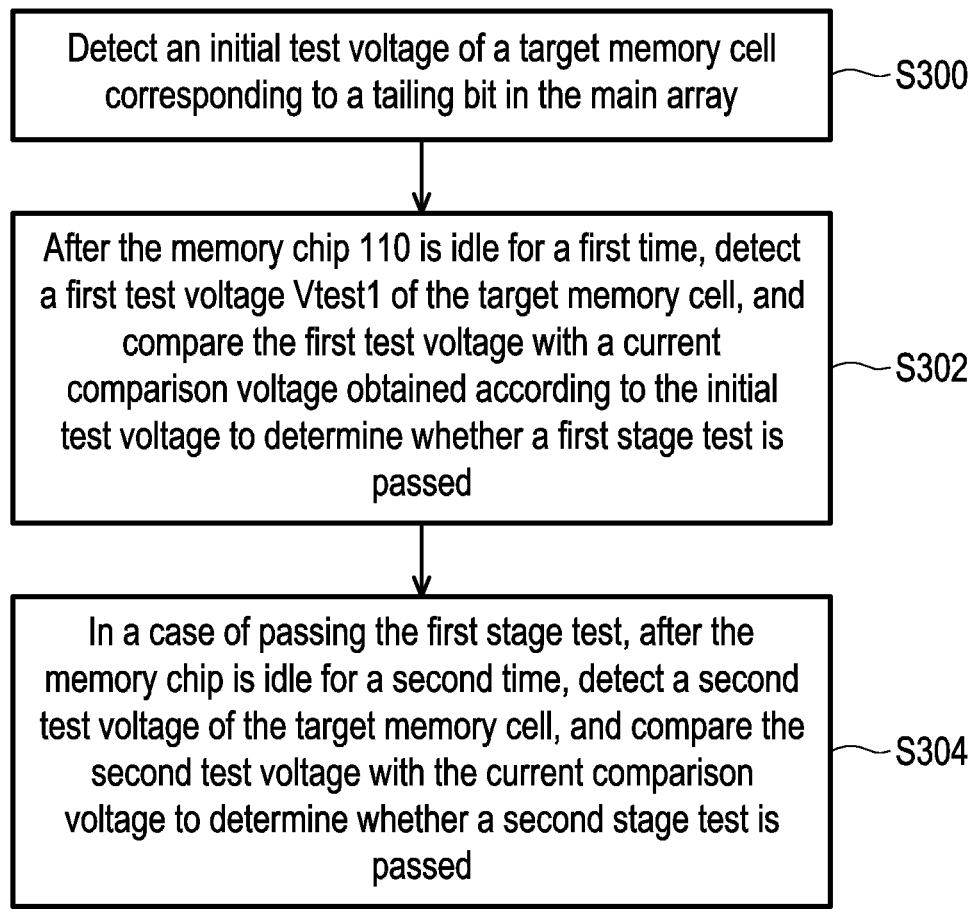
FIG. 3 is a flowchart of a testing method according to an embodiment of the disclosure.

Referring to FIGS. 1 to 3 together, a testing method in this embodiment is applicable to the semiconductor memory apparatus 100 in FIGS. 1 and 2. Hereinafter, steps of the testing method in this embodiment of the disclosure are described in conjunction with various elements in the semiconductor memory apparatus 100.

In step S300, the memory controller 120 is configured to detect an initial test voltage Vint of a target memory cell TC corresponding to a tailing bit in the main array 112. In detail, at the beginning, the operation controller 122 of the memory controller 120 performs a program operation on all memory cells (including the target memory cell TC) in the main array 112 one by one in units of blocks. The operation controller 122 is configured to apply a read voltage Vread to the target memory cell TC in the main array 112 after performing the program operation on the main array 112, so as to detect the initial test voltage Vint according to a read current Cread generated from the target memory cell TC. In addition, the operation controller 122 may store the initial test voltage Vint in the mini array 114 to avoid variation of the stored initial test voltage Vint. It should be noted that the tailing bit may be identified through Gaussian distribution presented by threshold voltages of all the memory cells in the main array 112, and the memory controller 120 may lock the target memory cell TC corresponding to the tailing bit accordingly. In addition, in practical applications, when the tailing bit of the memory chip 110 changes due to factors such as repair operations, the target memory cell TC in this embodiment also changes accordingly.

Next, in step S302, after the memory chip 110 is idle for a first time, the memory controller 120 detects a first test voltage Vtest1 of the target memory cell TC, and compares the first test voltage Vtest1 with a current comparison voltage Vverify to determine whether a first stage test is passed. In detail, the voltage comparator 126 of the memory controller 120 is configured to detect the first test voltage Vtest1 of the target memory cell TC after the memory chip 110 is idle for the first time, and compare the first test voltage Vtest1 with the current comparison voltage Vverify. In this embodiment, the so-called "idle" refers to a state where the memory chip 110 is placed in one place stably and does not perform any operation during a performance test for low temperature data retention.

In this embodiment, the comparison voltage Vverify is dynamically updated in response to a time the memory chip 110 is idle. Therefore, in this embodiment, the current comparison voltage Vverify varies with the time the memory chip 110 is idle. As shown in FIG. 2, the verification controller 124 of the memory controller 120 is configured to read the stored initial test voltage Vint from the mini array 114, and update the comparison voltage Vverify according to the initial test voltage Vint and the time the memory chip 110 is idle.

Figure 4:
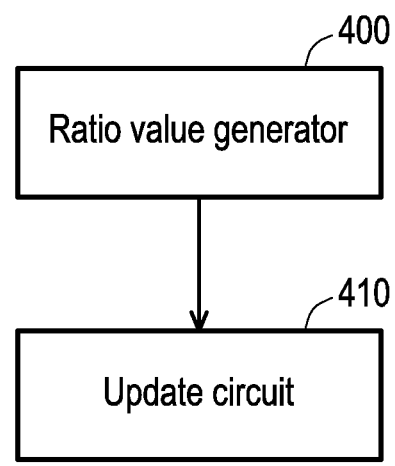
FIG. 4 is a schematic block diagram of a verification controller according to an embodiment of the disclosure.
Figure 5A:
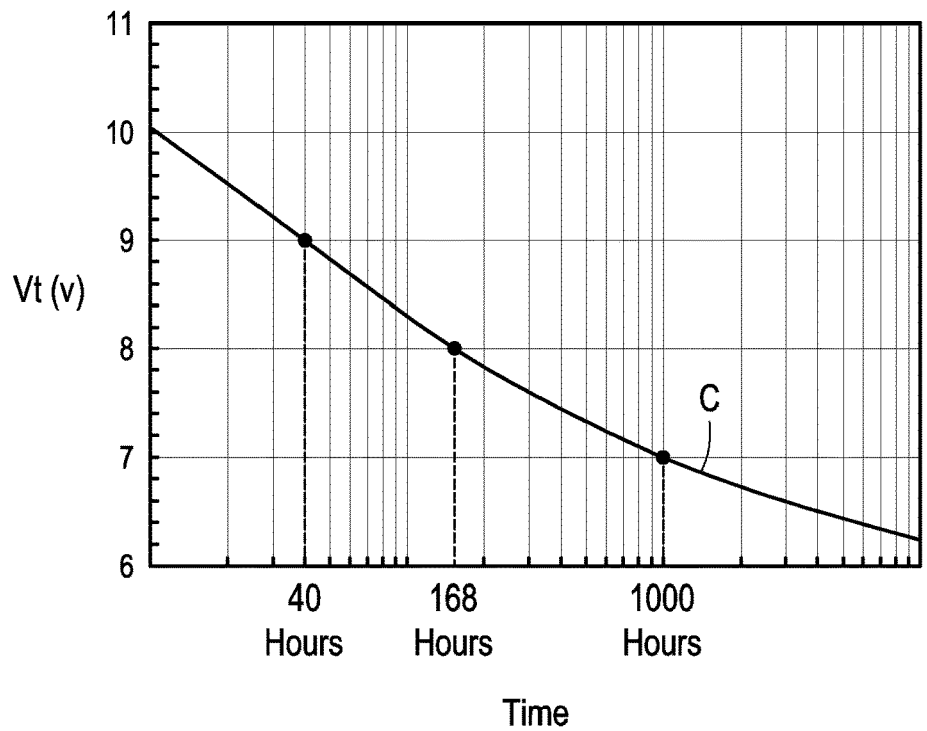
FIG. 5A is a diagram of a relationship between a threshold voltage and time according to an embodiment of the disclosure.

For example, referring to FIG. 4, the verification controller 124 includes a ratio value generator 400 and an update circuit 410 coupled to the ratio value generator 400. After the memory chip 110 is idle for the first time, the ratio value generator 400 may adjust a ratio value of the comparison voltage Vverify relative to the initial test voltage Vint to a first ratio value according to a length of the first time. In detail, FIG. 5A is a diagram of a relationship between a threshold voltage and time according to an embodiment of the disclosure. As shown in FIG. 5A, according to a Fowler-Nordheim tunneling model, it may be detected that a threshold voltage Vt of the memory cell decays with time. In FIG. 5A, a curve C of the threshold voltage Vt may be represented by the following formula.

$$Vt = AF_{ox}^2 e^{-B/F_{ox}}$$

Fox is an electric field applied to a junction, and a parameter A and a parameter B are physical property parameters related to electrons and dielectrics. According to a set specification that is required be achieved, at a specific time, a value of the parameter A is linearly proportional to a value of the parameter B.

Figure 5B:
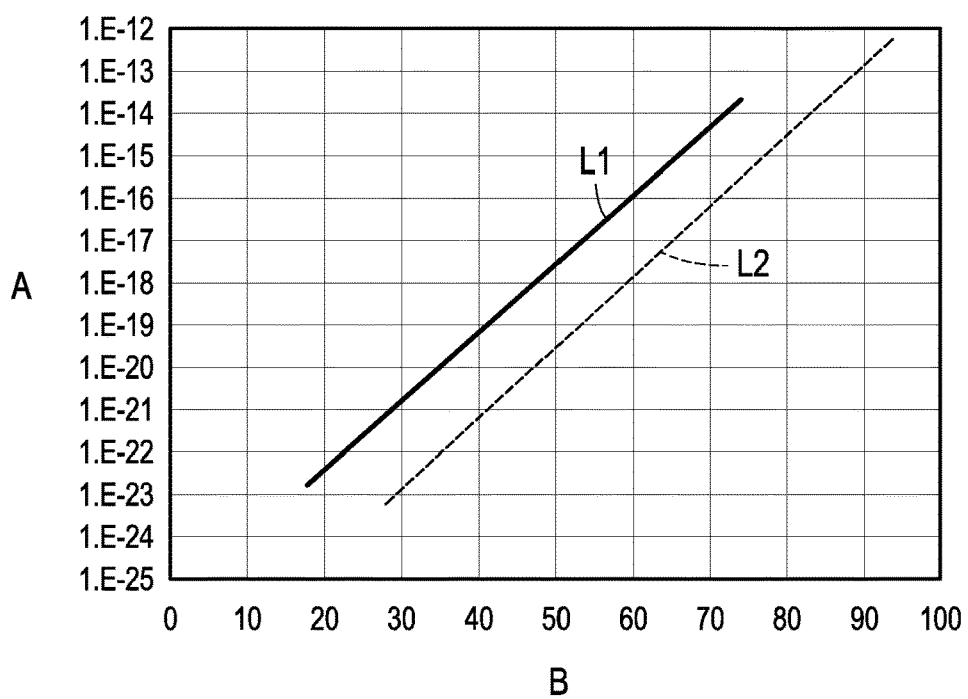
FIG. 5B is a diagram of a relationship between parameters according to an embodiment of the disclosure.

For example, FIG. 5B is a diagram of a relationship between parameters according to an embodiment of the disclosure. In FIG. 5B, a vertical axis is the parameter A, and a horizontal axis is the parameter B. A line L1 and a line L2 respectively represent relationships between the parameter A and the parameter B under two different specifications. In the specification corresponding to the line L1, the idle time is 1000 hours, and the threshold voltage Vt that meets the specification is 7 volts. In the specification corresponding to the line L2, the idle time is 10 years, and the threshold voltage Vt that meets the specification is 7 volts. As shown in FIG. 5B, no matter it is the line L1 or the line L2, the relationships between the parameter A and the parameter B are linear. In this way, the relationships between the parameter A and the parameter B may be used to deduce the attenuation of the threshold voltage Vt that meets a minimum specification under different time periods, thereby obtaining the relationship between the current comparison voltage Vverify and the initial test voltage Vint in this embodiment according to a physical model of a stress induced leakage current (SILC).

Figure 5C:
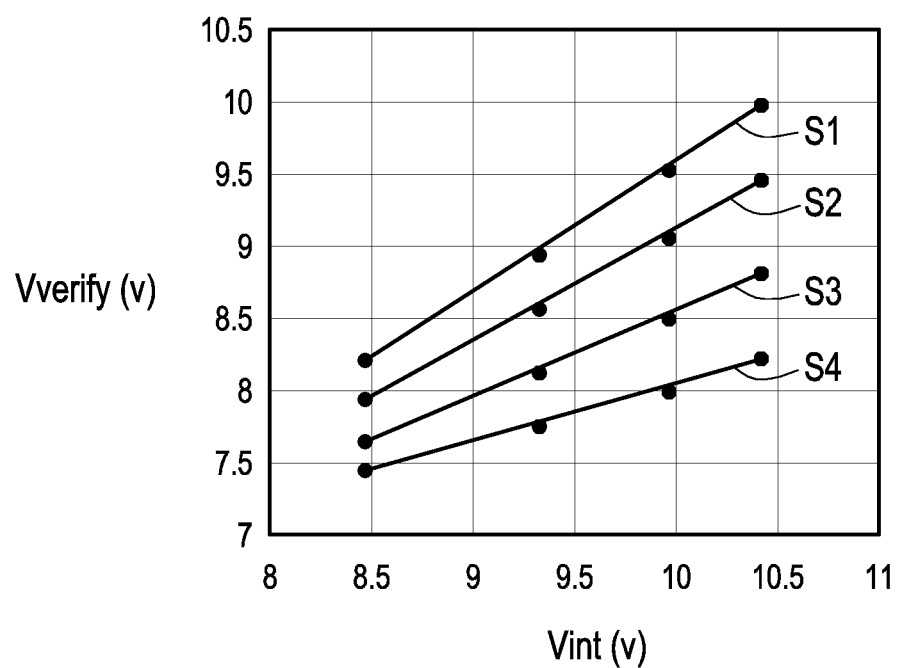
FIG. 5C is a diagram of a relationship between a current comparison voltage and an initial comparison voltage according to an embodiment of the disclosure.

Further, in FIG. 5C, trajectories S1, S2, S3, and S4 formed by various values of the comparison voltage Vverify relative to the initial test voltage Vint are shown when the memory chip 110 is idle for 20 hours, 40 hours, 80 hours, and 160 hours, respectively. According to FIG. 5C, the longer the time the memory chip 110 is idle is, the lower the ratio value of the comparison voltage Vverify relative to the initial test voltage Vint is.

The ratio value generator 400 may establish the ratio value of the comparison voltage Vverify relative to the initial test voltage Vint at an observation time point according to characteristics of the physical model of the stress induced leakage current. The following Table 1 exemplifies functions of the current comparison voltage Vverify at each of established observation time points (the idle time) associated with the initial test voltage Vint.

TABLE 1

| Observation time point (idle time) | Function |
| --- | --- |
| 20 hours | Function 1: Vverify = 0.9 × Vint + 0.5 |
| 40 hours | Function 2: Vverify = 0.75 × Vint + 1.5 |
| 80 hours | Function 3: Vverify = 0.58 × Vint + 2.7 |
| 160 hours | Function 4: Vverify = 0.39 × Vint + 4.1 |

The initial test voltage Vint is, for example, 8 volts. A ratio of the idle time to the current comparison voltage Vverify is 2: 0.6 to 0.8. A ratio of the idle time to a constant term in the above function is 2: 1.5 to 4. In this embodiment, a 0th time is, for example, 20 hours, and the first time is, for example, 40 hours. Therefore, the ratio value generator 400 may adjust the ratio value of the comparison voltage Vverify relative to the initial test voltage Vint from 0.9 to 0.75 (the first ratio value).

The update circuit 410 may receive the first ratio value from the ratio value generator 400. After the memory chip 110 is idle for the first time, the update circuit 410 may update a value of the comparison voltage Vverify to a first comparison value and transmit the comparison voltage Vverify updated to the first comparison value to the voltage comparator 126 by using the function 2 in Table 1 as an update criterion according to the first ratio value.

In step S302, when the first test voltage Vtest1 is greater than the current comparison voltage Vverify, the voltage comparator 126 determines that the first stage test has been passed.

Finally, in step S304, in a case of passing the first stage test, after the memory chip 110 is idle for a second time, the memory controller 120 detects a second test voltage Vtest2 of the target memory cell, and compares the second test voltage Vtest2 with the current comparison voltage Vverify to determine whether a second stage test is passed. The voltage comparator 126 of the memory controller 120 is configured to detect the second test voltage Vtest2 of the target memory cell TC after the memory chip 110 is idle for the second time, and compare the second test voltage Vtest2 with the current comparison voltage Vverify.

The comparison voltage Vverify is dynamically updated in response to the time the memory chip 110 is idle. Same as when the memory chip 110 is idle for the first time, after the memory chip 110 is idle for the second time, the ratio value generator 400 may adjust the ratio value of the comparison voltage Vverify relative to the initial test voltage to a second ratio value according to a length of the second time. In this embodiment, the second time is, for example, 160 hours. Therefore, the ratio value generator 400 may adjust the ratio value of the comparison voltage Vverify relative to the initial test voltage Vint to 0.39 (the second ratio value).

The update circuit 410 may receive the second ratio value from the ratio value generator 400. After the memory chip 110 is idle for the second time, the update circuit 410 may update the value of the comparison voltage Vverify to a second comparison value less than the first comparison value above and transmit the comparison voltage Vverify updated to the second comparison value to the voltage comparator 126 by using the function 4 in Table 1 as the update criterion according to the second ratio value.

In step S304, when the second test voltage Vtest2 is greater than the current comparison voltage Vverify, the voltage comparator 126 determines that the second stage test has been passed. That is, specification requirements for the low temperature data retention has been passed, thereby completing a test for the memory chip 110.

By means of the above testing method, it is possible to quickly test whether the memory chip may pass the specification requirements for the low temperature data retention within a relatively short period of time (for example, 160 hours), so that a time for research and development and a product cycle may be shortened.

In addition, at present, it is necessary to manually expand row data to define and analyze the test specifications of the low temperature data retention. By means of the above testing method, the memory controller may directly determine the ratio value according to dependence on time thereof without manual adjustment, thereby updating the comparison voltage and confirming whether the test is passed.

Figure 6A:
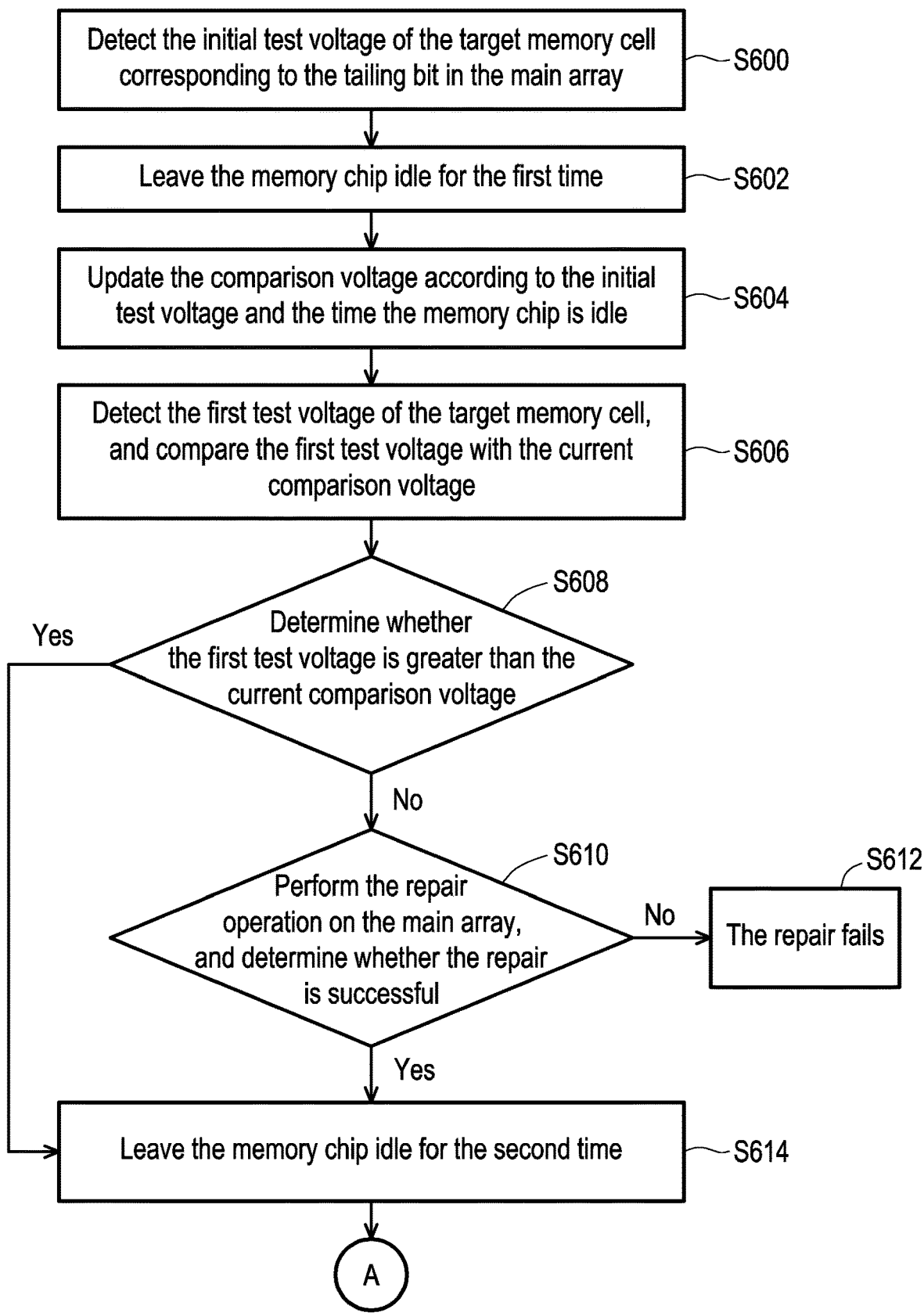
FIGS. 6A and 6B are flowcharts of a testing method according to an embodiment of the disclosure.
Figure 6B:
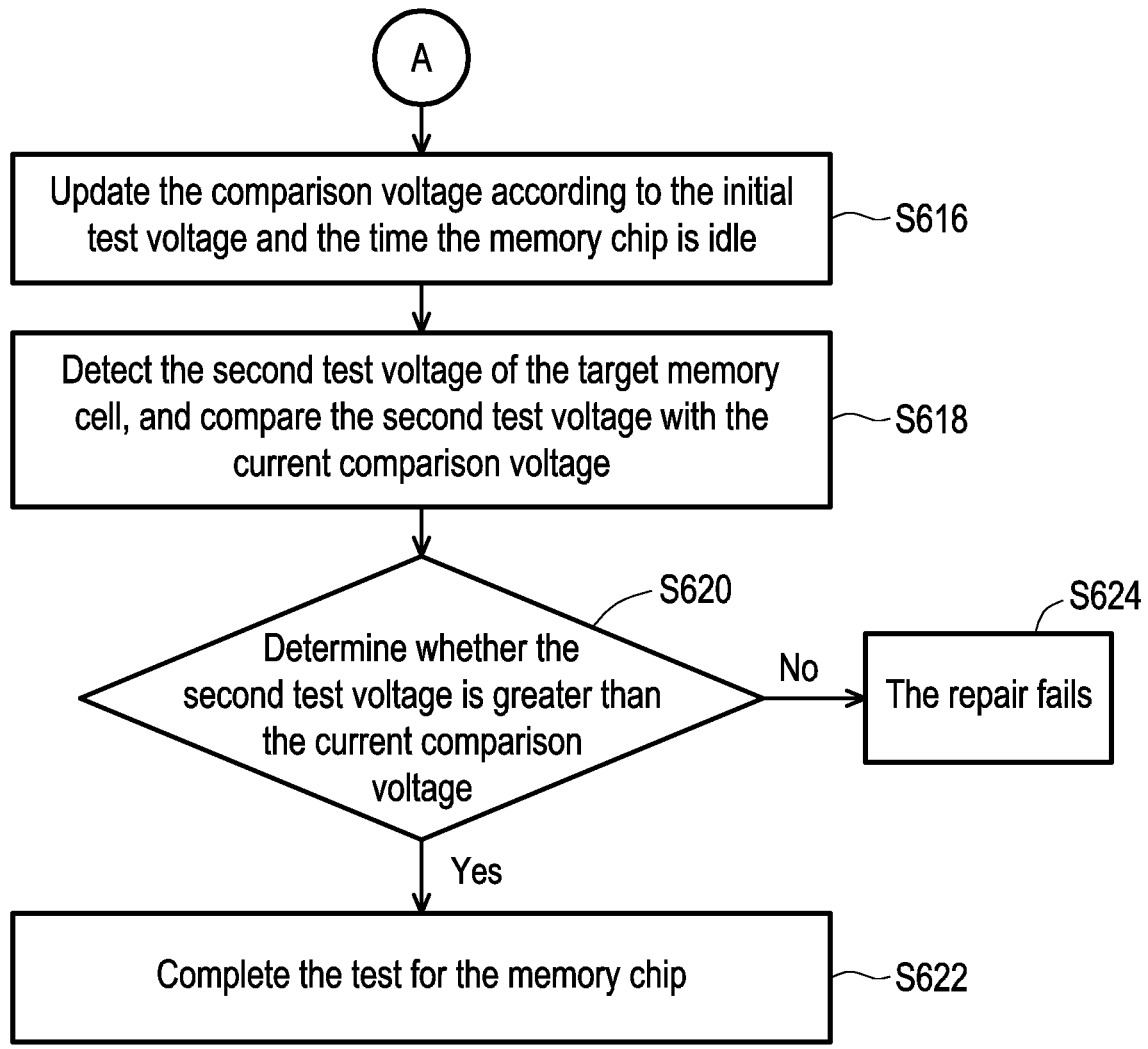

Hereinafter, another embodiment is given to describe the testing method in the disclosure in more detail. FIGS. 6A and 6B are flowcharts of a testing method according to an embodiment of the disclosure. Referring to FIGS. 1, 2, 6A, and 6B together, the testing method in this embodiment is applicable to the semiconductor memory apparatus 100 in FIGS. 1 and 2. Hereinafter, steps of the testing method in this embodiment of the disclosure are described in conjunction with the various elements in the semiconductor memory apparatus 100.

In step S600, the operation controller 122 detects the initial test voltage Vint of the target memory cell TC corresponding to the tailing bit in the main array 112.

In step S602, the memory chip 110 is left idle for the first time. Next, in step S604, the verification controller 124 updates the comparison voltage Vverify according to the initial test voltage Vint and the time the memory chip 110 is idle. In this embodiment, an updating method of the comparison voltage Vverify is the same as or similar to that adopted in the foregoing embodiments. Therefore, the same details will not be repeated in the following.

In step S606, the voltage comparator 126 detects the first test voltage Vtest1 of the target memory cell TC, and compares the first test voltage Vtest1 with the current comparison voltage Vverify. Next, in step S608, the voltage comparator 126 determine whether the first test voltage Vtest1 is greater than the current comparison voltage Vverify. If not, in step S610, the operation controller 122 performs the repair operation on the main array 112. In this embodiment, the repair operation is, for example, replacing the tested target memory cell TC with a memory cell in a spare memory block. In addition, in step S610, the operation controller 122 further determines whether the repair is successful. If there is an available spare memory block currently, the replacement may be completed, which means that the repair is successful. If there is no available spare memory block currently, the replacement may be performed, which means that the repair fails. When it is determined that the repair fails, in step S612, the voltage comparator 126 determines that the test for the memory chip 110 fails, regards the memory chip 110 as damaged, and ends the testing method in this embodiment. When it is determined that the repair is successful, it is continued to leave the memory chip 110 idle in step S614 until reaching the second time.

If in step S608, the voltage comparator 126 determines that the first test voltage Vtest1 is greater than the current comparison voltage Vverify, it is directly proceeded to step S614 to continue to leave the memory chip 110 idle for the second time.

Then, after a node A, it is proceeded to step S616 in FIG. 6B, and the verification controller 124 updates the comparison voltage Vverify again according to the initial test voltage Vint and the time the the memory chip 110 is idle. In step S618, the voltage comparator 126 detects the second test voltage Vtest2 of the target memory cell TC, and compares the second test voltage Vtest2 with the updated current comparison voltage Vverify.

Next, in step S620, the voltage comparator 126 determines whether the second test voltage Vtest2 is greater than the current comparison voltage Vverify. If yes, in step S622, the voltage comparator 126 completes the test for the memory chip 110, which means that the memory chip 110 has passed the specification requirements for the low temperature data retention. If not, in step S624, the voltage comparator 126 determines that the test for the memory chip 110 fails, regards the memory chip 110 as damaged, and ends the testing method in this embodiment. It should be noted that the current comparison voltage Vverify after the memory chip 110 is idle for the second time in step S620 is less than the current comparison voltage Vverify after the memory chip 110 is idle for the first time in step S608.

Based on the above, in the semiconductor memory apparatus and the testing method thereof in the disclosure, the comparison voltage used for testing may be dynamically updated, so as to avoid a situation of overkill or underkill of the memory chip during the test. In addition, the semiconductor memory apparatus and the testing method thereof in the disclosure may further quickly test whether the memory chip may pass the specification requirements for the low temperature data retention in the relatively short period of time, and shorten the time for research and development and the product cycle, thereby saving the cost for research and development and obtaining the maximum benefit of the product.

What is claimed is:

1. A semiconductor memory apparatus, comprising:
   a memory chip comprising a main array and a mini array; and
   a memory controller coupled to the memory chip and configured to detect an initial test voltage of a target memory cell corresponding to a tailing bit in the main array,
   wherein after the memory chip is idle for a first time, the memory controller applies a read voltage to the target memory cell to detect a first test voltage of the target memory cell according to a first read current generated from the target memory cell and compares the first test voltage with a current comparison voltage to determine whether a first stage test is passed,
   in a case of passing the first stage test, after the memory chip is idle for a second time, the memory controller applies the read voltage to the target memory cell to detect a second test voltage of the target memory cell according to a second read current generated from the target memory cell and compares the second test voltage with the current comparison voltage to determine whether a second stage test is passed, and the current comparison voltage is dynamically updated in response to a time the memory chip is idle.

2. The semiconductor memory apparatus according to claim 1, wherein the current comparison voltage after the memory chip is idle for the second time is less than the current comparison voltage after the memory chip is idle for the first time.

3. The semiconductor memory apparatus according to claim 1, wherein the memory controller comprises:
   a first hardware processor configured to apply the read voltage to the target memory cell in the main array after performing a program operation on the main array to detect the initial test voltage according to an initial read current generated from the target memory cell, and store the initial test voltage in the mini array.

4. The semiconductor memory apparatus according to claim 1, wherein the memory controller comprises:
   a second hardware processor configured to update the current comparison voltage according to the initial test voltage and the time the memory chip is idle.

5. The semiconductor memory apparatus according to claim 4, wherein the second hardware processor comprises:
   a ratio value generator adjusting a ratio value of the current comparison voltage relative to the initial test voltage to a first ratio value according to a length of the first time after the memory chip is idle for the first time, and adjusting the ratio value of the current comparison voltage relative to the initial test voltage to a second ratio value according to a length of the second time after the memory chip is idle for the second time; and
   an update circuit coupled to the ratio value generator, updating a value of the current comparison voltage to a first comparison value according to the first ratio value after the memory chip is idle for the first time, and updating the value of the current comparison voltage to a second comparison value according to the second ratio value after the memory chip is idle for the second time, wherein the second comparison value is less than the first comparison value.

6. The semiconductor memory apparatus according to claim 1, wherein the memory controller comprises:
   a voltage comparator configured to detect the first test voltage of the target memory cell after the memory chip is idle for the first time, and compare the first test voltage with the current comparison voltage,
   wherein when the first test voltage is not greater than the current comparison voltage, the voltage comparator notifies a first hardware processor to perform a repair operation on the main array.

7. The semiconductor memory apparatus according to claim 6, wherein when the first test voltage is greater than the current comparison voltage, the memory chip is continued to be left idle,
   after the memory chip is idle for the second time, the voltage comparator detects the second test voltage of the target memory cell, and compares the second test voltage with the current comparison voltage,
   when the second test voltage is greater than the current comparison voltage, the voltage comparator completes a test for the memory chip.

8. A testing method of a semiconductor memory apparatus, wherein the semiconductor memory apparatus has a memory chip comprising a main array, and the testing method comprises:
   detecting an initial test voltage of a target memory cell corresponding to a tailing bit in the main array;
   after the memory chip is idle for a first time, applying a read voltage to the target memory cell to detect a first test voltage of the target memory cell according to a first read current generated from the target memory cell, and comparing the first test voltage with a current comparison voltage to determine whether a first stage test is passed; and
   in a case of passing the first stage test, after the memory chip is idle for a second time, applying the read voltage to the target memory cell to detect a second test voltage of the target memory cell according to a second read current generated from the target memory cell, and comparing the second test voltage with the current comparison voltage to determine whether a second stage test is passed, wherein the current comparison voltage is dynamically updated in response to a time the memory chip is idle.

9. The testing method of the semiconductor memory apparatus according to claim 8, wherein the current comparison voltage after the memory chip is idle for the second time is less than the current comparison voltage after the memory chip is idle for the first time.

10. The testing method of the semiconductor memory apparatus according to claim 8, wherein detecting the initial test voltage of the target memory cell corresponding to the tailing bit in the main array comprises:
    applying the read voltage to the target memory cell in the main array after performing a program operation on the main array to detect the initial test voltage according to an initial read current generated from the target memory cell; and
    storing the initial test voltage in a mini array of the memory chip.

11. The testing method of the semiconductor memory apparatus according to claim 8, further comprising:
    updating the current comparison voltage according to the initial test voltage and the time the memory chip is idle.

12. The testing method of the semiconductor memory apparatus according to claim 11, wherein updating the current comparison voltage according to the time the memory chip is idle comprises:

adjusting a ratio value of the current comparison voltage relative to the initial test voltage to a first ratio value according to a length of the first time after the memory chip is idle for the first time;

updating a value of the current comparison voltage to a first comparison value according to the first ratio value after the memory chip is idle for the first time;

adjusting the ratio value of the current comparison voltage relative to the initial test voltage to a second ratio value according to a length of the second time after the memory chip is idle for the second time; and updating the value of the current comparison voltage to a second comparison value according to the second ratio value after the memory chip is idle for the second time, wherein the second comparison value is less than the first comparison value.

13. The testing method of the semiconductor memory apparatus according to claim 8, wherein after comparing the first test voltage with the current comparison voltage, the testing method further comprises:

when the first test voltage is not greater than the current comparison voltage, performing a repair operation on the main array.

14. The testing method of the semiconductor memory apparatus according to claim 8, wherein after comparing the first test voltage with the current comparison voltage, the testing method further comprises:

when the first test voltage is greater than the current comparison voltage, continuing to leave the memory chip idle, wherein after comparing the second test voltage with the current comparison voltage, the testing method further comprises:

when the second test voltage is greater than the current comparison voltage, completing a test for the memory chip.

* * * * *